United States Patent [19]
Tavrow et al.

[11] Patent Number: 5,742,556
[45] Date of Patent: Apr. 21, 1998

[54] REDUNDANCY SCHEME FOR SEMICONDUCTOR RAMS

[75] Inventors: Lee Stuart Tavrow; Mark Ronald Santoro, both of Sunnyvale, Calif.

[73] Assignee: Micro Magic, Inc., Sunnyvale, Calif.

[21] Appl. No.: 773,393

[22] Filed: Dec. 26, 1996

[51] Int. Cl.[6] .................................................. G11C 8/00
[52] U.S. Cl. ............................................. 365/225.7; 365/200
[58] Field of Search ................................... 365/225.7, 200

[56] References Cited

U.S. PATENT DOCUMENTS

| | | | |
|---|---|---|---|
| 5,243,570 | 9/1993 | Saruwatari | 365/201 |
| 5,293,348 | 3/1994 | Abe | 365/200 |
| 5,392,247 | 2/1995 | Fujita | 365/200 |
| 5,404,331 | 4/1995 | McClure | 365/200 |
| 5,548,553 | 8/1996 | Cooper et al. | 365/200 |

*Primary Examiner*—David C. Nelms
*Assistant Examiner*—Michael T. Tran
*Attorney, Agent, or Firm*—Limbach & Limbach L.L.P.

[57] ABSTRACT

An integrated circuit memory structure includes a plurality of regular columns of memory cells arranged as a sequence such that each regular column except the last in the sequence has an associated adjacent regular column. Each regular column has associated sense amplifier circuitry and write driver circuitry for, respectively, reading output data from and writing input data to the regular column. At least one redundant column of memory cells is also provided. The structure also includes a programmable element that responds to a programming stimulus by providing a programming signal that identifies one of the regular columns as a defective column. Reconfiguration circuitry responds to the programming signal by reconfiguring the memory structure such that the sense amplifier circuitry and the write driver circuitry of each regular column in the sequence, beginning with the defective column, is reconfigured to be associated with the adjacent regular column. The sense amplifier circuitry associated with the last regular column in the sequence is reconfigured to be associated with the redundant column, which has its own associated write driver. The concepts of column redundancy are also applicable to row redundancy.

10 Claims, 5 Drawing Sheets

REDUNDANCY SCHEME FOR SEMICONDUCTOR RAMS

BACKGROUND OF THE INVENTION

1. Field of the Invention

The present invention relates to integrated circuit memory devices and, in particular, to a new scheme for implementing column and/or row redundancy with minimal area overhead, performance loss, and fewer number of fuses.

2. Discussion of the Related Art

Adding redundancy into random access memory (RAM) structures improves yield and, thus, reduces final device cost. This cost reduction must offset the cost increase of redundancy due to area overhead, performance loss, redundancy testing/fusing, and design time.

FIG. 1 shows a two column slice from a conventional SRAM with no redundancy. In the FIG. 1 circuitry 10, each set 12 of typically differential bit lines is sensed by a single sense amplifier 14 for illustrative purposes only. Normally, more than one set of differential bit lines is multiplexed together using pFET pass-gates. This column muxing can be added to SRAMs with or without column redundancy and, hence, has been omitted for clarity. Each column also includes a write driver 16 for writing input data $D_{in}$ to a selected cell in the column.

In FIG. 2, a conventional column redundancy approach is illustrated. In this case, only a single redundant column 20 has been added, although multiple independent redundant columns could similarly be added. In addition, redundant columns can be added and shifted together in pairs to provide better fault coverage since bit lines in adjacent columns can short together. Typically, as illustrated, laser blown fuses 22 are used to program these extra column(s) to replace defective columns as typically determined during wafer level testing.

The scheme illustrated in FIG. 2 has the following problems. In order to write an individual SRAM cell, one of the bit lines must be pulled to ground. Since the bit lines have a very large capacitance due to the large number of cells on them, the transmission gates must be very large, which slows down the read path due to the additional capacitance. In addition, this scheme requires a large number of fuses, one per column, which must fit into a column pitch. Finally, depending on the position of the bad column, many, if not all, of the fuses may have to be blown to fix a single fault.

SUMMARY OF THE INVENTION

The present invention provides an integrated circuit memory structure that includes a plurality of regular columns of memory cells arranged as a sequence such that each regular column except the last in the sequence has an adjacent regular column associated therewith. Each regular column has associated sense amplifier circuitry and write driver circuitry for, respectively, reading output data from and writing input data to the regular column. At least one redundant column of memory cells is also provided. The structure also includes a programmable element that responds to a programming stimulus by providing a programming signal that identifies one of the regular columns as a defective column. Reconfiguration circuitry responds to the programming signal by reconfiguring the memory structure such that the sense amplifier circuitry and the write driver circuitry of each regular column in the sequence, beginning with the defective column, is reconfigured to be associated with the adjacent regular column. The sense amplifier circuitry associated with the last regular column in the sequence is reconfigured to be associated with the redundant column, which has its own associated write driver.

The concepts of the invention are also applicable to row redundancy.

A better understanding of the features and advantages of the present invention will be obtained by reference to the following detailed description and accompanying drawings which set forth an illustrative embodiment in which the principles of the invention are utilized.

DESCRIPTION OF THE INVENTION

Figure 1:
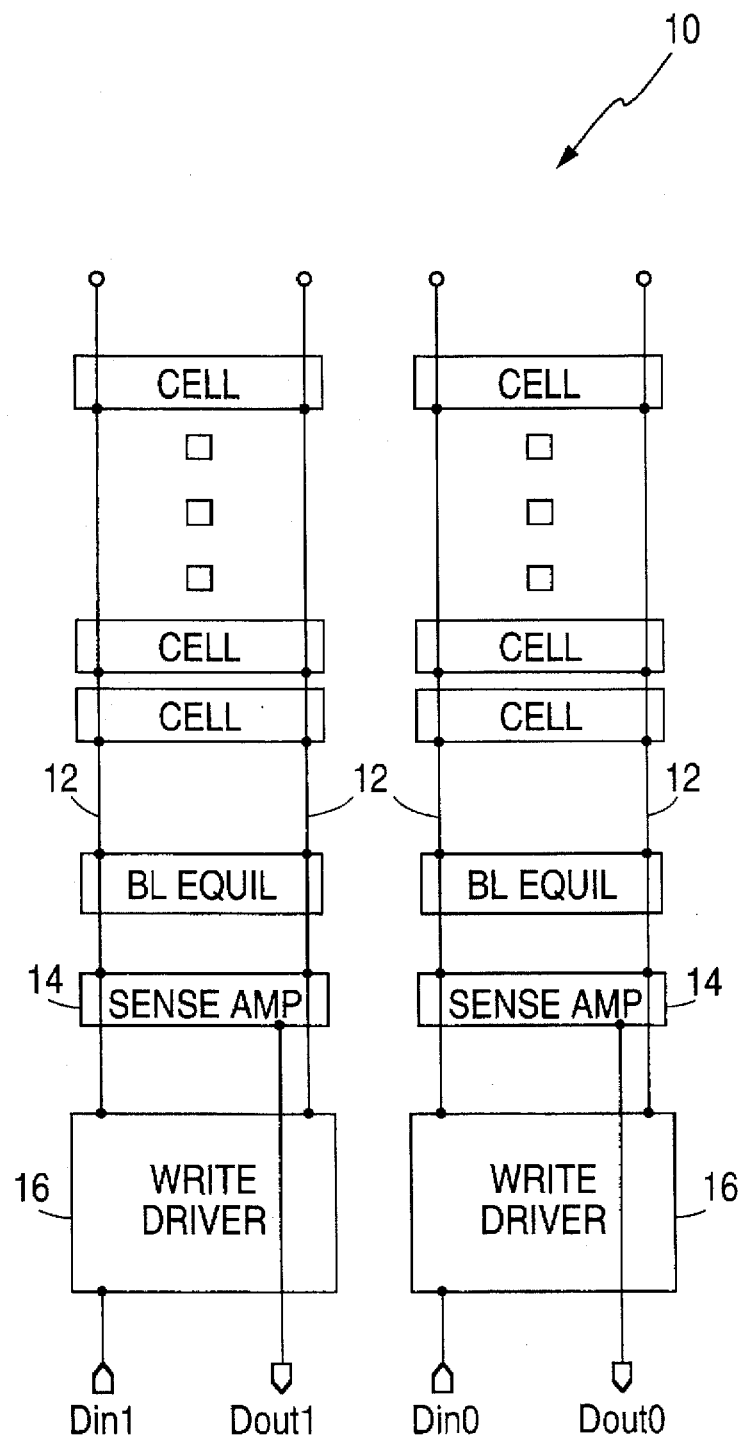
FIG. 1 is a schematic diagram illustrating a slice of columns from a conventional SRAM with no redundancy.
Figure 2:
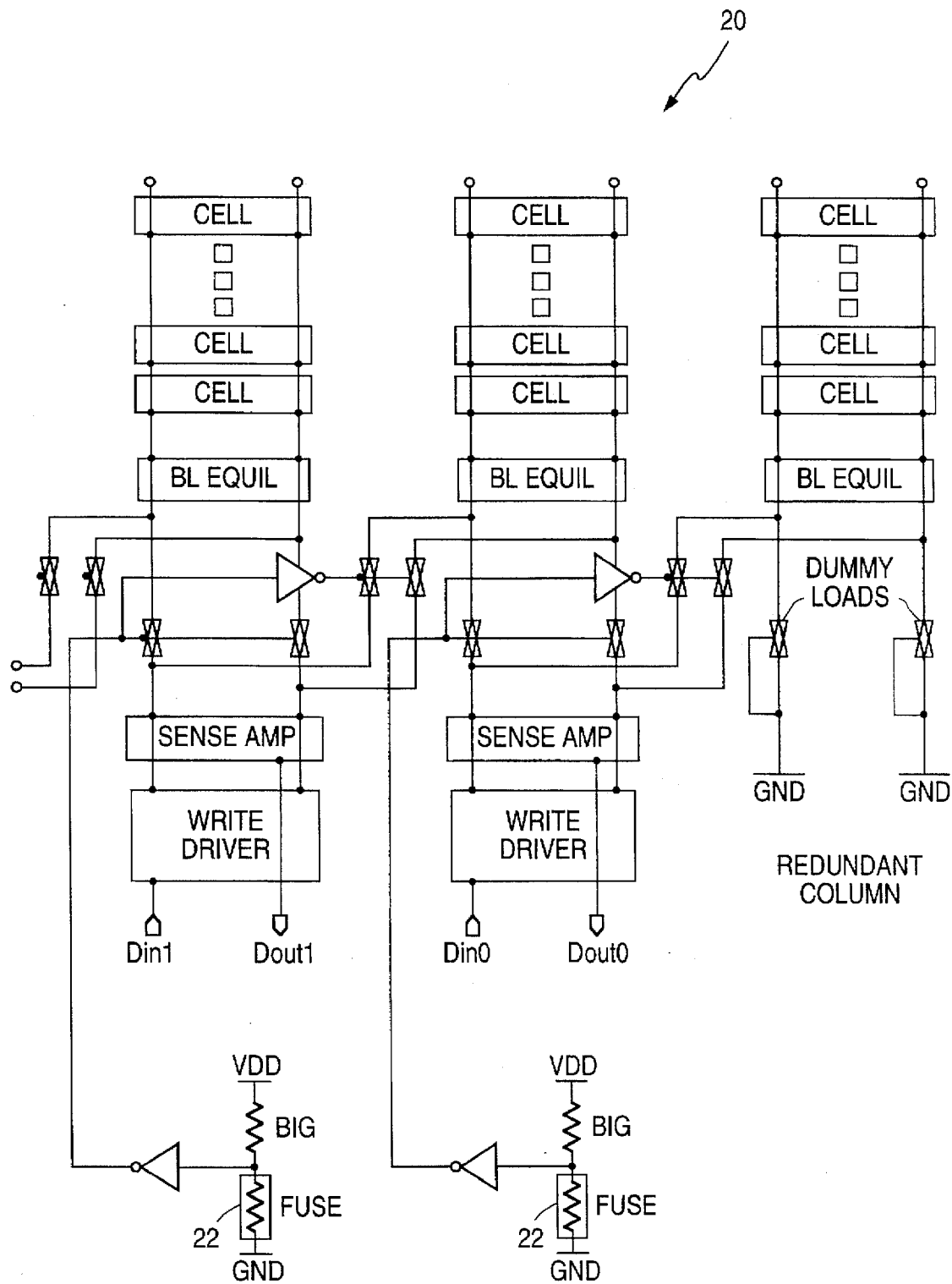
FIG. 2 is a schematic diagram illustrating a slice of columns from a conventional SRAM with conventional column redundancy.
Figure 3:
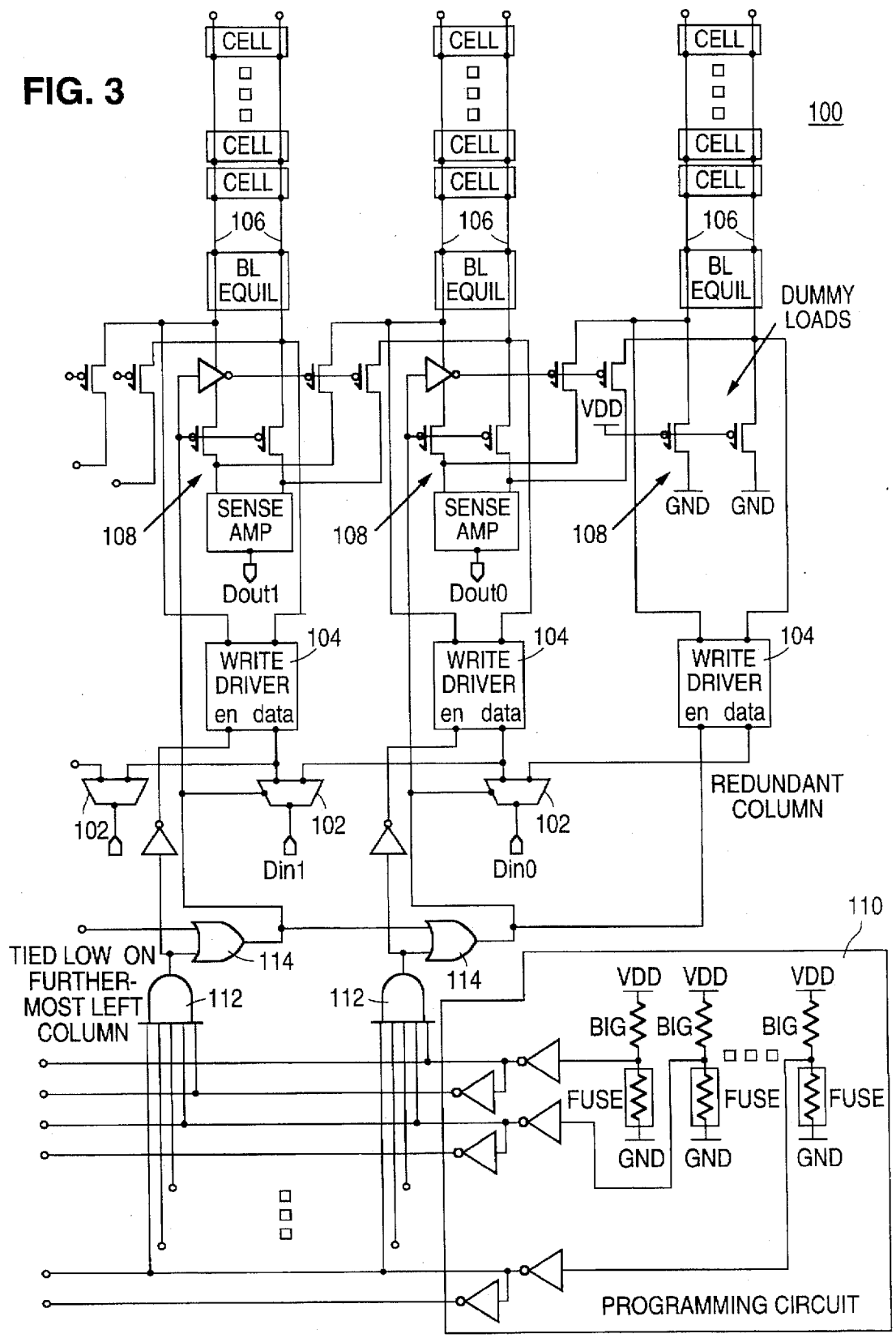
FIG. 3 is a schematic diagram illustrating column redundancy concepts in accordance with the present invention.

FIG. 3 illustrates an embodiment of the present invention applied to column redundancy. As shown in the FIG. 3 circuitry 100, the writing multiplexers 102 occur before the write bit line drivers 104. Therefore, large transmission gates on the bit lines 106 are not required. Instead, only small pFET pass gates 108, which have a minimal effect on access time, are added to the bit lines.

The fuse programming data generated by a programming circuit 110 is undecoded (unlike the prior art) and, hence, requires very few fuses (log2the number of columns) instead of one per column. The fuse data is decoded in the columns by the combination of an AND gate 112 and an OR gate 114 for each regular column, as shown in FIG. 3. (Note that, as one skilled in the art will appreciate, a CMOS implementation would use NAND gates, NOR gates, and inverters to implement this function.)

Since the inputs to AND gates 112 are connected in a counting manner, only one AND gate 112 is activated for any combination of fuse programming. The active AND gate 112 corresponds to the defective regular column. The active AND gate output activates the associated OR gate 114 and the signal then ripples sequentially through the OR gates 114 to the "right." Hence, from the defective column to the right, the SRAM columns are all shifted to the right and, finally at the far right, the redundant column, which includes its own write driver 104, is also used. Note that this signal can ripple through many series OR gates 114, which may require 100 ns or more to complete. However, since this delay only occurs during startup, it is inconsequential. Further note that the write drivers are disabled in the defective column; when no columns are defective, then the write driver in the redundant column is disabled. The sense amplifier is absent from the redundant column.

While there appears to be more logic in the FIG. 3 column redundancy scheme 100 versus the prior art, most of this logic is set up at power up and, thus, can be minimum or near minimum sized devices.

Figure 4:
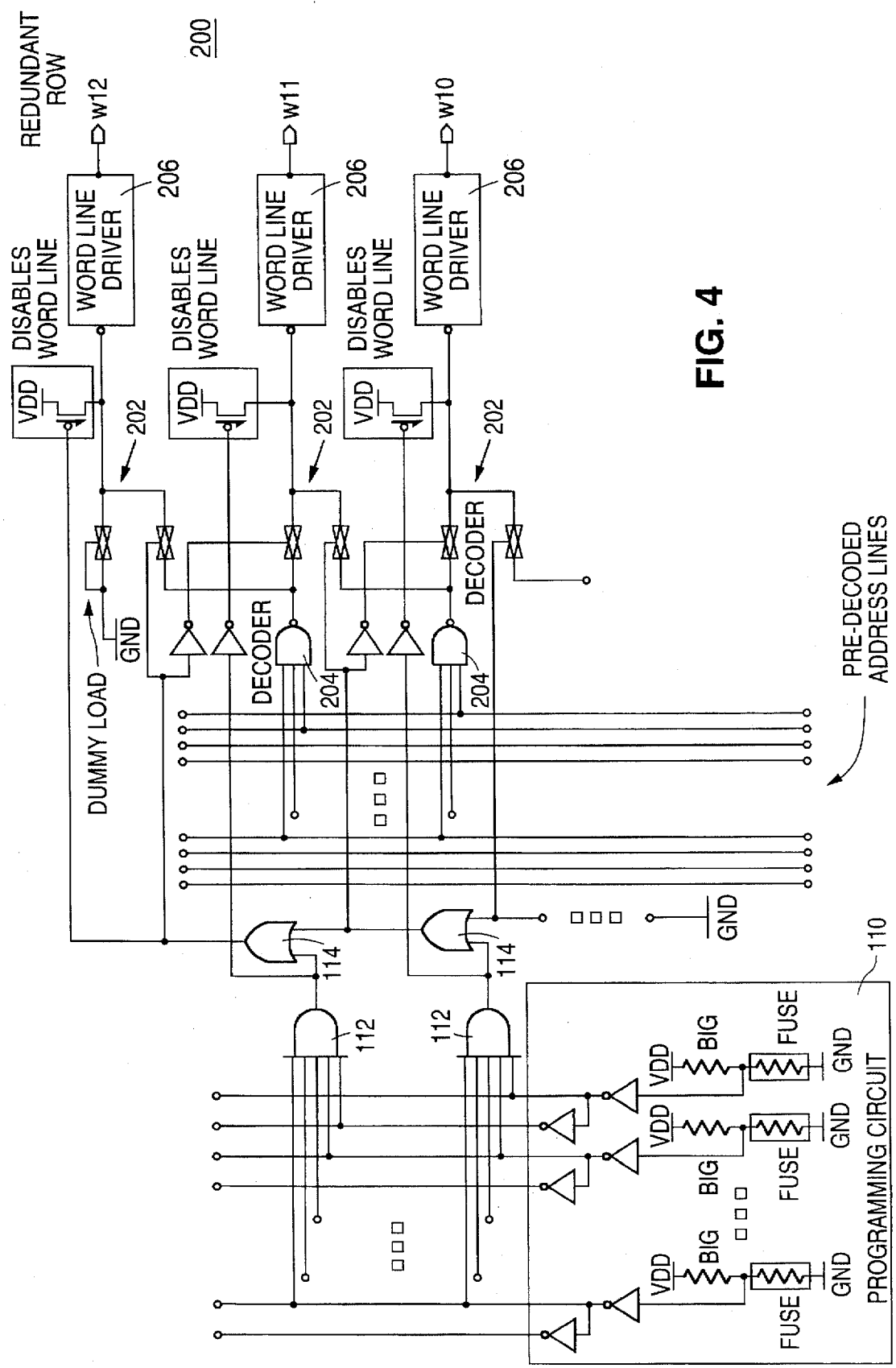
FIG. 4 is a schematic diagram illustrating row redundancy concepts in accordance with the present invention.

FIG. 4 illustrates a fuse decoding scheme 200 in accordance with the invention as applied to row redundancy. The fuse decoding is identical to the FIG. 3 column redundancy scheme, but is rotated and, hence, the number of fuses required is log2 the number of rows. In the FIG. 4 embodiment, full transmission gates 202 can be used to implement the row shifting since the load from the output of the NAND decoder gate 204 to the input of the word line driver 206 is minimal.

Figure 5A:
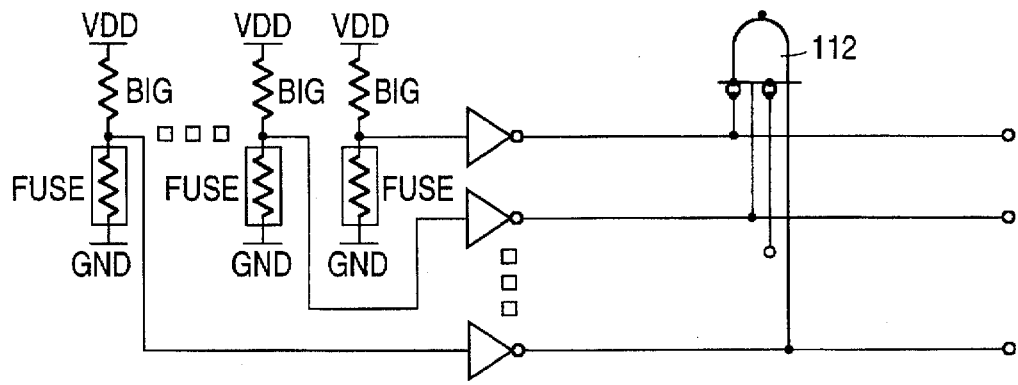
FIG. 5A is a logic diagram illustrating a first alternative embodiment of a programmable circuit utilizable in accordance with the concepts of the present invention.
Figure 5B:
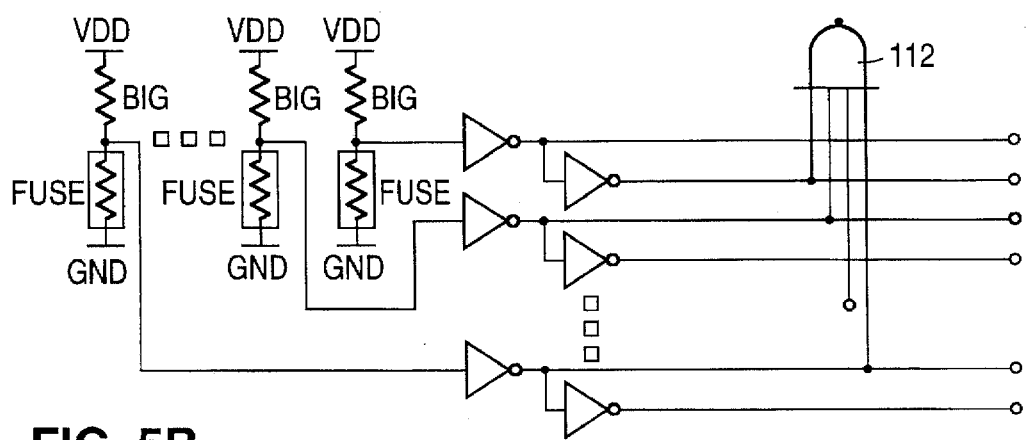
FIG. 5B is a logic diagram illustrating a second alternative embodiment of a programmable circuit utilizable in accordance with the concepts of the present invention.
Figure 5C:
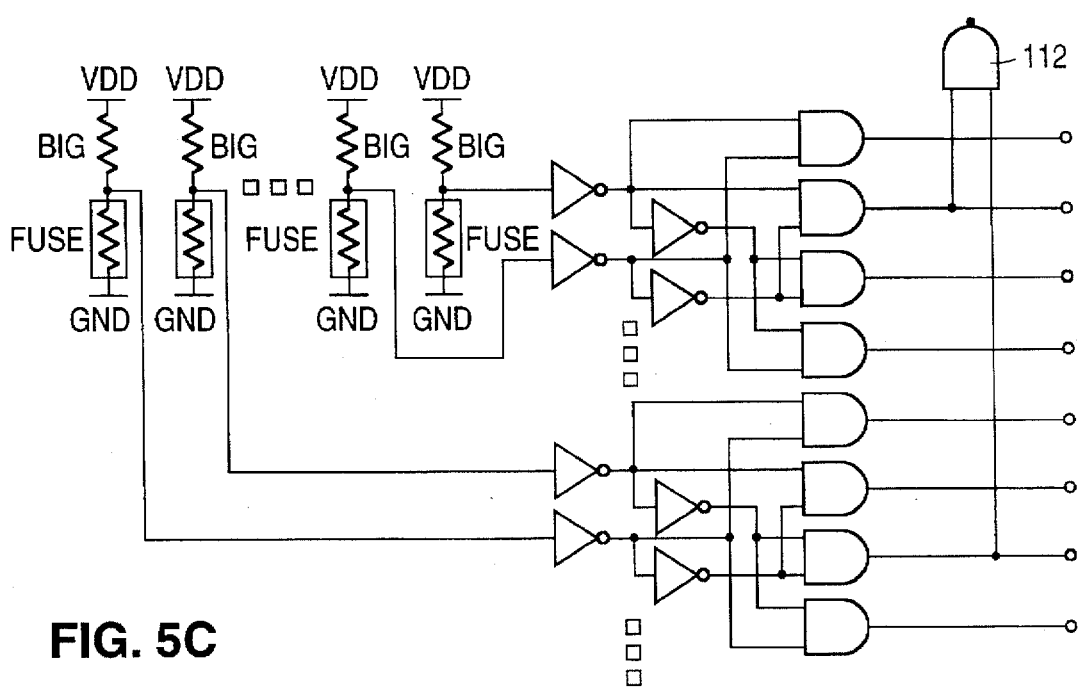
FIG. 5C shows a third alternative embodiment of a programmable circuit utilizable in accordance with the concepts of the present invention.

FIGS. 5A-5C show three variations on the programmable circuit 110, illustrating predecoding of the programming wires. FIG. 5A shows one extreme, the "undecoded" case, with the fewest wires, but the largest gate 112 required per column to do the decode (note that the "bubbles" shown on the AND gate 112 in FIG. 5A must be explicit inverters in an actual implementation). FIG. 5B shows a 1 bit predecode. In the FIG. 5C "predecoded" case, the largest number of wires are required, but the decode gate 112 is the simplest. One skilled in the art will appreciate that any one of these approaches may be desirable over the others depending upon the physical implementation of the SRAM and technology.

It should be understood that various alternatives to the embodiments of the invention described herein may be employed in practicing the invention. Thus, it is intended that the following claims define the scope of the invention and that methods and structures within the scope of these claims and their equivalents be covered thereby.

What is claimed is:

1. An integrated circuit memory structure comprising:
   a plurality of regular columns of memory cells arranged as a sequence of said regular columns, each regular column having sense amplifier circuitry and write driver circuitry associated therewith for, respectively, reading output data from and writing input data to said regular column;
   a redundant column of memory cells, the redundant column having redundant write driver circuitry associated therewith for writing input data to said redundant column;
   a programmable element that responds to a programming stimulus applied to the programmable element by providing a programming signal that identifies one of the plurality of regular columns as a defective column; and
   reconfiguration circuitry, connected to the programmable element, to the regular columns and to the redundant column, and that responds to the programming signal by reconfiguring the memory structure such that the sense amplifier circuitry associated with each regular column in the sequence of regular columns, beginning with the defective column, is reconfigured to be associated with the next regular column in the sequence of regular columns and the sense amplifier circuitry associated with the last regular column in the sequence of regular columns is reconfigured to be associated with the redundant column.

2. An integrated circuit memory structure comprising:
   a plurality of regular columns of memory cells arranged as a sequence of said regular columns, each regular column having sense amplifier circuitry and write driver circuitry associated therewith for, respectively, reading output data from and writing input data to said regular column;
   a redundant column of memory cells, the redundant column having redundant write driver circuitry associated therewith for writing input data to said redundant column;
   a fuse programmable element that responds to fuse programming data by providing a programming signal that identifies one of the plurality of regular columns as a defective column;
   each regular column further having associated therewith
   (i) a first logic gate connected to receive the programming signal and that provides an inactive output signal if the first logic gate is not associated with the defective column and that provides an active output signal if the first logic gate is associated with the defective column;
   (ii) a second logic gate that responds to an active output signal provided by the first logic gate by also providing an active output signal, the output of each second logic gate of each regular column in the sequence of regular columns being connected as an input to the second logic gate of the next regular column in the sequence of regular columns such that the second logic gate associated with each regular column in the sequence subsequent to the defective column also provides an active output signal;
   (iii) first switching circuitry that responds to an inactive output signal received from the second logic gate associated with said regular column by enabling engagement of the associated sense amplifier circuitry with said regular column and that responds to an active output signal received from the second logic gate associated with said regular column by disabling engagement of the associated sense amplifier circuitry with said regular column and enabling engagement of the associated sense amplifier circuitry with the next regular column in the sequence of regular columns, whereby an active output signal provided by the second logic gate associated with the last regular column in the sequence of regular columns disables engagement of the associated sense amplifier circuitry with said last regular column and enables engagement of the associated sense amplifier circuity with the redundant column; and
   (iv) second switching circuitry that responds to an inactive output signal received from the second logic gate associated with said regular column by enabling engagement of the associated write driver circuitry with said regular column and that responds to an active output signal received from the second logic gate associated with said regular column by disabling engagement of the associated write driver circuitry with said regular column and by enabling engagement of the associated write driver circuitry with the next regular column in the sequence of regular columns.

3. An integrated circuit memory structure as in claim 2 and wherein the first logic gate comprises an AND gate and the second logic gate comprises an OR gate.

4. An integrated circuit memory structure as in claim 2 and wherein the first logic gate comprises a NAND gate and the second logic gate comprises a NOR gate.

5. An integrated circuit memory structure as in claim 2 and wherein the first switching circuitry comprises pMOS transistors disposed in bit lines of each column between the associated sense amplifier and the memory cells of said column.

6. An integrated circuit memory structure as in claim 2 and wherein the second switching circuitry comprises a multiplexer disposed between the first logic gate and the write driver circuitry of said column.

7. an integrated circuit memory structure comprising:
- a plurality of regular rows of memory cells arranged as a sequence of said regular rows, each regular row having associated therewith address decoder circuitry for activating an associated address decoder identified by an address signal appearing on predecoded address lines connected to the address decoders and word line driver circuitry for activating a word line associated with said word line driver circuitry in response to activation of said associated address decoder;
- a redundant row of memory cells, the redundant row having redundant word line driver circuitry associated therewith for activating an associated redundant word line;
- a programmable element that responds to a programming stimulus applied to the programmable element by providing a programming signal that identifies one of the plurality of regular rows as a defective row; and
- reconfiguration circuitry, connected to the programmable element, to the regular rows and to the redundant row, and that responds to the programming signal by reconfiguring the memory structure such that the address decoder circuitry associated with each regular row in the sequence of regular rows, beginning with the defective row, is reconfigured to provide its output to the word line driver associated with the next regular row in the sequence of regular rows and the address decoder associated with the last regular row in the sequence of regular rows is reconfigured to have its output provided to the redundant word line driver circuitry.

8. An integrated circuit memory structure comprising:
- a plurality of regular rows of memory cells arranged as a sequence of said regular rows, each regular row having associated therewith address decoder circuitry for activating an associated address decoder identified by an address signal appearing on predecoded address lines connected to said address decoders and word line driver circuitry for activating a word line associated with said word line driver circuitry in response to activation of said associated address decoder;
- a redundant row of memory cells, the redundant row having redundant word line driver circuitry associated therewith for activating an associated redundant word line;
- a fuse programmable element that responds to fuse programming data by providing a programming signal that identifies one of the plurality of regular rows as a defective row;

each regular row further having associated therewith
  (i) a first logic gate connected to receive the programming signal and that provides an inactive output signal if the first logic gate is not associated with the defective row and provides an active signal if the first logic gate is associated with the defective row;
  (ii) a second logic gate that responds to an active output signal provided by the first logic gate by also providing an active output signal, the output of each second logic gate of each regular row in the sequence of regular rows being connected as an input to the second logic gate of the next regular row in the sequence of regular rows such that the second logic gate associated with each regular row in the sequence of regular rows subsequent to the defective row also provides an active output signal;
  (iii) switching circuitry that responds to an inactive output signal received from the second logic gate associated with said regular row by enabling engagement of the associated address decoder circuitry with said associated word line driver and that responds to an active output signal received from the second logic gate associated with said regular row by disabling engagement of the associated address decoder with the associated word line driver circuitry of said regular row and enabling engagement of the associated address decoder circuitry with the word line diver circuitry of the next regular row in the sequence of regular rows, whereby an active output signal provided by the second logic gate associated with the last regular row in the sequence of regular rows disables engagement of the associated address decoder with the word line driver associated with said last regular row and enables engagement of the associated address decoder with the redundant word line driver circuitry.

9. An integrated circuit memory structure as in claim 8 and wherein the first logic gate comprises an AND gate and the second logic gate comprises an OR gate.

10. An integrated circuit memory structure as in claim 8 and wherein the first logic gate comprises an NAND gate and the second logic gate comprises an NOR gate.

* * * * *